United States Patent
Anda et al.

(10) Patent No.: US 6,329,227 B2
(45) Date of Patent: Dec. 11, 2001

(54) METHOD OF PATTERNING ORGANIC POLYMER FILM AND METHOD FOR FABRICATING SEMICONDUCTOR DEVICE

(75) Inventors: Yoshiharu Anda, Okayama; Mitsuru Nishitsuji, Osaka; Katsuhiko Kawashima, Hyogo; Tsuyoshi Tanaka, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/789,738

(22) Filed: Feb. 22, 2001

(30) Foreign Application Priority Data

Feb. 22, 2000 (JP) .................................... 12-043927

(51) Int. Cl.⁷ ............................. H01L 21/00; H01L 21/84
(52) U.S. Cl. ..................... 438/151; 438/161; 438/484; 438/586
(58) Field of Search ..................... 438/151, 161, 438/586, 484, 784, 923, 168, 268, 305

(56) References Cited

U.S. PATENT DOCUMENTS

| 5,114,780 | * | 5/1992 | Mercer et al. | 428/195 |
| 5,559,055 | * | 9/1996 | Chang et al. | 437/195 |
| 6,086,679 | * | 7/2000 | Lee et al. | 118/724 |
| 6,140,456 | * | 10/2000 | Lee et al. | 528/196 |
| 6,184,589 | * | 2/2001 | Budnaitis et al. | 257/924 |
| 6,246,118 | * | 6/2001 | Buynoski | 257/758 |

FOREIGN PATENT DOCUMENTS

| 11-17006 | 1/1999 | (JP) . |
| 11-214404 | 8/1999 | (JP) . |

* cited by examiner

Primary Examiner—Michael Lebentritt
(74) Attorney, Agent, or Firm—Eric J. Robinson; Nixon Peabody LLP

(57) ABSTRACT

An organic polymer film patterning method includes the steps of: defining a resist film on a selected area of a substrate; depositing an organic polymer film over the substrate by a plasma CVD process so that the resist film is covered with part of the organic polymer film; and removing the resist film along with the part of the organic polymer film that has covered the resist film.

15 Claims, 8 Drawing Sheets

METHOD OF PATTERNING ORGANIC POLYMER FILM AND METHOD FOR FABRICATING SEMICONDUCTOR DEVICE

BACKGROUND OF THE INVENTION

The present invention relates to a method of patterning an organic polymer film and a method for fabricating a semiconductor device by utilizing the patterning method.

Recently, millimeter wave bands, or ultrahigh frequency bands of 30 GHZ or more, are frequency resources that should hopefully be developed for a broad variety of applications including multi-media mobile telecommunications units and radio frequency LANs. To ensure a sufficient gain for an FET in ultrahigh frequency bands like these, the gate electrode of the FET should have its length and resistance both reduced. On top of that, a parasitic capacitance associated with the gate electrode should also be reduced. A T-shaped (or mushroom-shaped) gate electrode would be a best choice so far among various measures for reducing the gate length and gate resistance. So a T-gate electrode is adopted more and more often for that purpose.

A typical known semiconductor device including a T-gate electrode will now be described with reference to FIG. 3, which schematically illustrates a cross-sectional structure for a known semiconductor device of this type.

As shown in FIG. 3, the device includes semi-insulating GaAs substrate 51, epitaxial layer 52 deposited on the substrate 51 and a T-gate electrode 56 formed on the epitaxial layer 52. The bottom of the T-gate electrode 56 makes a Schottky contact with the surface of the epitaxial layer 52. A pair of ohmic electrodes 55 is further formed on, and makes an ohmic contact with, the epitaxial layer 52. For the other parts that are not covered with the T-gate electrode 56 or ohmic electrodes 55, the upper surface of the epitaxial layer 52 is covered with an interlevel dielectric film 54 of $SiO_2$. Also, to electrically isolate the illustrated device from adjacent ones, the epitaxial layer 52 is surrounded with an isolation region 53.

A method for fabricating the known semiconductor device will be described next with reference to FIGS. 4A through 4G, which illustrate respective process steps for fabricating the device shown in FIG. 3.

First, as shown in FIG. 4A, an epitaxial layer 52 is deposited on a semi-insulating GaAs substrate 51 by an MOCVD or MBE process, and an isolation region 53 is defined by implanting dopant ions into a selected region of the substrate.

Next, as shown in FIG. 4B, an insulating film 54 of $SiO_2$ is deposited on the epitaxial layer 52 by a CVD process, and then a photoresist 55, having an opening 55a with a width of 0.1 μm, is defined on the insulating film 54.

Thereafter, as shown in FIG. 4C, an opening 54a is formed in the insulating film 54 by dry-etching the film 54 anisotropically using the photoresist 55 as a mask, and then the photoresist 55 is removed as shown in FIG. 4D.

Subsequently, as shown in FIG. 4E, parts of the insulating film 54, where ohmic electrodes will be formed, are removed to form another pair of openings, and then ohmic electrodes 56 are formed on the particular areas of the epitaxial layer 52 that are exposed inside the openings. Next, another photoresist 57 with an opening 57a is defined as shown in FIG. 4F.

Finally, a metal film (not shown) is deposited over the photoresist 57 so that the opening 57a is filled with the metal, and then the photoresist 57 is removed along with the excessive metal, thereby forming a T-gate electrode 58 as shown in FIG. 4G.

This device includes the T-gate electrode 58, and can have a shorter gate length and reduced gate resistance. However, the insulating film 54 is made of $SiO_2$ with a dielectric constant of about 4.0, so the gate parasitic capacitance is not so small. That is to say, this device has a large fringe capacitance due to the particular shape of the gate electrode 58 and the material of the insulating film 54.

To reduce the fringe capacitance of the gate electrode 58, the insulating film 54 should preferably be made of a material with a lower dielectric constant (which will be herein called a "low-κ material"). An organic polymer may be used as an alternative material for the insulating film 54, because an organic polymer has a dielectric constant lower than that of $SiO_2$. However, if the above process is performed as it is just by substituting an organic polymer for $SiO_2$, then it is difficult to form the opening 54a at a desired small size.

In the above process, the opening 54a is formed in the insulating film 54 by dry-etching the film 54 anisotropically using the photoresist 55 with the opening 55a as a mask as shown in FIG. 4C. Then, the opening 54a of the insulating film 54 will usually be greater in width than the counterpart 55a of the photoresist 55. This is also true even when the insulating film 54 is made of an organic polymer. In that case, the width of the resultant opening 54a will be no less than about 0.7 μm, for example. That is to say, the opening 54a cannot have a width as small as 0.3 μm or less (e.g., 0.1 μm) according to the known process.

To avoid this problem, the opening 54a may be formed by a lift-off technique, not by using the photoresist 55 having the opening 55a. But we found that another problem is caused by doing so.

FIGS. 5A and 5B are cross-sectional views illustrating the process steps of forming an opening by a lift-off technique. First, a substrate 61 is prepared, and a fine-line resist pattern 62 is defined on the substrate 61 by a photolithographic technique as shown in FIG. 5A. Next, as shown in FIG. 5B, an organic polymer film 63 is deposited over the substrate 61. However, since an organic polymer is usually liquid, the resist pattern 62 cannot be lifted off as it is. That is to say, even if the resist pattern 62 is lifted off, the film 63 of the liquid organic polymer will planarize itself after that. As a result, no opening can be formed in the organic polymer film 63. To form an opening in the organic polymer film 63 by a lift-off technique, the liquid organic polymer should be cured by annealing it at 200° C. or more. However, the resist pattern 62 is usually cured or deformed at about 150° C. Accordingly, it is meaningless to cure the liquid organic polymer by annealing it at 200° C. or more.

SUMMARY OF THE INVENTION

It is therefore an object of the present invention to provide a method of patterning an organic polymer film in such a manner that the film can have an opening of a very small width.

It is another object of the invention to provide a method for fabricating a semiconductor device so that the gate electrode will have a reduced fringe capacitance.

An inventive organic polymer film patterning method includes the steps of: defining a resist film on a selected area of a substrate; depositing an organic polymer film over the substrate by a plasma CVD process so that the resist film is covered with part of the organic polymer film; and removing the resist film along with the part of the organic polymer film that has covered the resist film.

In one embodiment of the present invention, the organic polymer film is preferably a low-κ film with a dielectric constant lower than that of $SiO_2$.

In this particular embodiment, the low-κ film may be made of a cyclobutane derivative.

More specifically, the cyclobutane derivative is preferably benzocyclobutene (BCB).

In an alternative embodiment, the low-κ film may also be made of a fluoropolymer.

In still another embodiment, the organic polymer film is preferably deposited within an inert gas ambient.

In yet another embodiment, a deposition temperature of the organic polymer film is preferably lower than a temperature at which the resist film starts to degrade.

An inventive method for fabricating a semiconductor device includes the steps of: defining a resist film on a selected area of a substrate; depositing an organic polymer film over the substrate by a plasma CVD process so that the resist film is covered with part of the organic polymer film; removing the resist film along with the part of the organic polymer film that has covered the resist film, thereby forming an opening in the organic polymer film; and forming a gate electrode on the selected area of the substrate that is exposed inside the opening of the organic polymer film.

In one embodiment of the present invention, the organic polymer film is preferably a low-κ film with a dielectric constant lower than that of $SiO_2$.

In this particular embodiment, the low-κ film may be made of a cyclobutane derivative.

More specifically, the cyclobutane derivative is preferably benzocyclobutene (BCB).

In an alternative embodiment, the low-κ film may also be made of a fluoropolymer.

In still another embodiment, the organic polymer film is preferably deposited within an inert gas ambient.

In yet another embodiment, a deposition temperature of the organic polymer film is preferably lower than a temperature at which the resist film starts to degrade.

In yet another embodiment, the opening preferably has a width of 0.3 μm or less and the gate electrode is a T-gate electrode.

In the present invention, an organic polymer film is deposited by a plasma CVD process. Therefore, unlike the known liquid organic polymer film, a fine-line opening can be formed according to the present invention in the organic polymer film just by removing the resist film.

DESCRIPTION OF THE PREFERRED EMBODIMENTS

Hereinafter, preferred embodiments of the present invention will be described with reference to the accompanying drawings. It should be noted that the present invention is in no way limited to the following illustrative embodiments.

Figure 1:
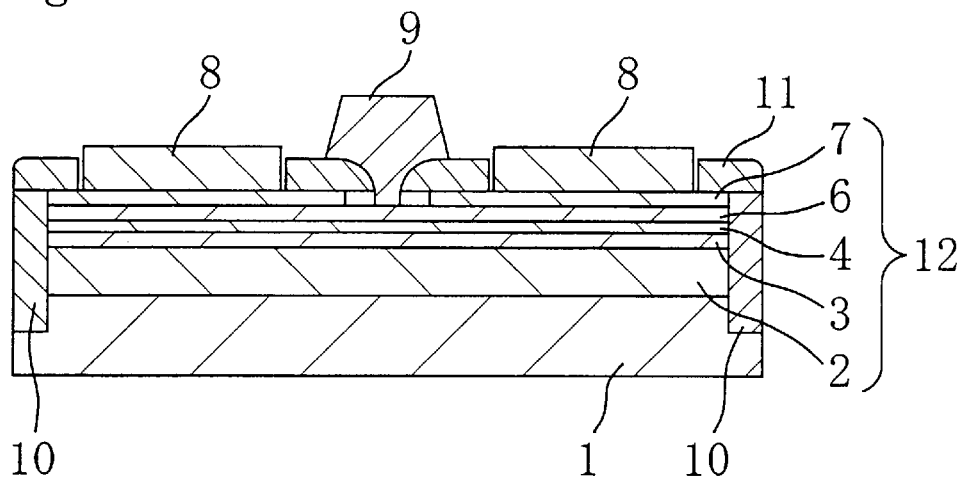
FIG. 1 is a cross-sectional view illustrating a semiconductor device formed by a fabrication process according to an embodiment of the present invention.

FIG. 1 schematically illustrates a cross-sectional structure for a semiconductor device formed by a fabrication process according to an embodiment of the present invention.

As shown in FIG. 1, the device includes buffer layer 2, channel layer 3, spacer layer 4, doped layer (not shown) 5, Schottky layer 6 and cap layer 7 that have been stacked in this order on a semi-insulating GaAs substrate 1. The thicknesses of the layers 2, 3, 4, 6 and 7 are 1 μm, 20 nm, 5 nm, 30 nm and 100 nm, respectively. These layers 2 through 7 are formed by an epitaxy process, so will be herein called an "epitaxial layer" 12 collectively.

The buffer layer 2 is made of undoped GaAs and buffers lattice misfit between the epitaxial layer 12 and substrate 1. The channel layer 3 is made of undoped $In_{0.2}Ga_{0.8}As$ and provides a channel where carriers move. The spacer layer 4 is made of undoped $Al_{0.25}Ga_{0.75}As$. The doped layer 5 is formed by planar doping just one atomic layer of Si ions, which are n-type dopant ions, at a dose of $5 \times 10^{12}$ cm$^{-2}$. The Schottky layer 6 is made of undoped $Al_{0.25}Ga_{0.75}As$. And the cap layer 7 is made of $n^+$-GaAs.

A pair of ohmic electrodes 8 exists on the cap layer 7, while a gate electrode 9 has been formed on the Schottky layer 6. The other parts of the epitaxial layer 12, which are not covered with the ohmic electrodes 8 or gate electrode 9, are covered with an organic polymer film 11 made of benzocyclobutene (BCB). The film 11 is made of an organic polymer with a dielectric constant κ lower than that of $Sio_2$, and will be herein called a "low-κ film".

As shown in FIG. 1, the gate electrode 9 is formed in T-shape. Accordingly, the gate resistance at the upper part thereof with an increased width is lower than usual, while the gate length at the lower part thereof with a reduced width is shorter than usual. The organic polymer film 11 has an opening so that the gate electrode 9 can make a Schottky contact with the Schottky layer 6 therethrough. To attain the reduced gate length, the opening has a width of 0.3 μm or less (e.g., about 0.1 μm). Those parts of the insulating film located near the gate electrode 9 are made of an organic polymer with a relatively low dielectric constant. Thus, the device shown in FIG. 1 can have a reduced gate parasitic capacitance. That is to say, since the dielectric constant of the organic polymer film 11 is lower than that of the normal insulating film of $SiO_2$, a smaller fringe capacitance is formed between the gate electrode 9 and epitaxial layer 12. Around the outer periphery of the ohmic electrodes 8, an isolation region 10 has been defined to electrically isolate the illustrated device from adjacent ones.

A method of patterning an organic polymer film and a method for fabricating a semiconductor device according to this embodiment of the present invention will now be described with reference to FIGS. 2A through 2K. FIGS. 2A through 2K are cross-sectional views illustrating respective process steps for fabricating a semiconductor device according to this embodiment.

Figure 2A:
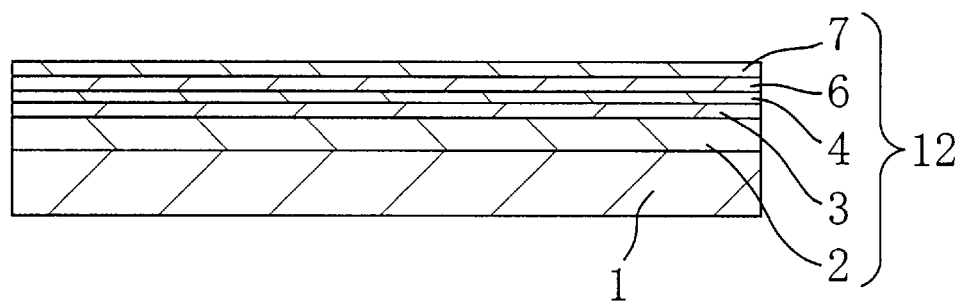
FIGS. 2A through 2K are cross-sectional views illustrating respective process steps for fabricating the device shown in FIG. 1.

First, as shown in FIG. 2A, buffer, channel, spacer, doped, Schottky and cap layers 2, 3, 4, 5, 6 and 7 are deposited in this order on a substrate 1 of semi-insulating GaAs by an MOCVD or MBE process, thereby forming an epitaxial layer 12. It should be noted that the substrate 1 with the epitaxial layer 12 will sometimes be called a "substrate" in the following description.

Figure 2B:
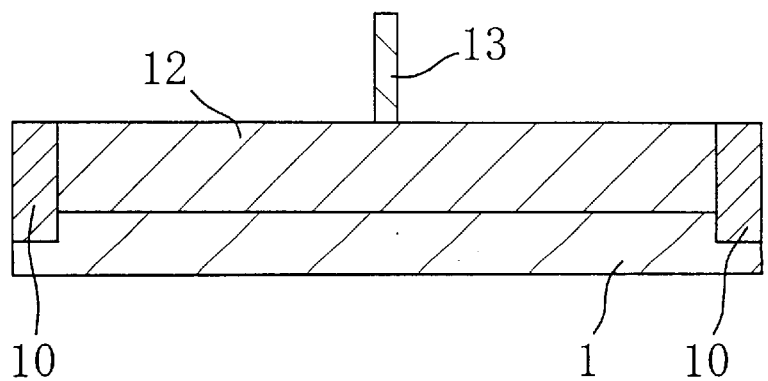

Next, as shown in FIG. 2B, an isolation region 10 is defined by implanting dopant ions into a predetermined region of the substrate. Then, a resist film 13 with a width of 0.1 μm is defined on the epitaxial layer 12 by a lithographic technique. The resulting device does not have to be electrically isolated by the isolation region 10, but may have a mesa structure by etching away predetermined parts of the epitaxial layer 12. The width of the resist film 13 will eventually define the gate length. Accordingly, the width of the resist film 13 may be set appropriately depending on a desired gate length of the resultant semiconductor device. The thickness of the resist film 13 is preferably about 1 μm.

Figure 2C:
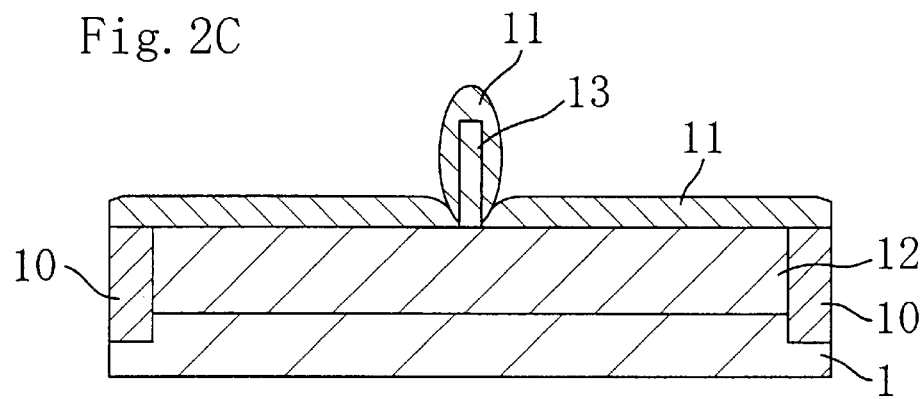

Subsequently, as shown in FIG. 2C, an organic polymer film 11 is deposited, by a plasma CVD process, to a thickness of 200 nm over the epitaxial layer 12 so as to cover the resist film 13. In this embodiment, the organic polymer film 11 is formed by a plasma CVD process. Accordingly, the organic polymer film 11 can be deposited at such a temperature as not degrading the resist film 13 thermally. Normally, the resist film 13 thermally degrades at 150° C. or more, for example. So the temperature of the substrate may be set to less than 150° C., for example. To carry out the deposition process easily and at a low cost, a coating technique, by which a liquid organic polymer is applied onto the substrate, is most preferable. However, this embodiment of the present invention intentionally uses a plasma CVD process, which is more complicated and less cost effective than the coating technique but which can be performed at such a temperature as not degrading the resist film 13 thermally. Also, unlike the known coating process, the organic polymer film 11 can be deposited by the plasma CVD process of this embodiment to a substantially uniform thickness (i.e., about 200 nm) over the epitaxial layer 12 as well as over the side and upper surfaces of the resist film 13. Parts of the organic polymer film 11, located at the corners between the resist film 13 and epitaxial layer 12, are tapered toward the upper surface of the epitaxial layer 12.

The organic polymer film 11, deposited by the plasma CVD process, is a low-κ film with a dielectric constant lower than that of $SiO_2$ (i.e., from about 4.0 to about 4.5). In the illustrated embodiment, the low-κ film 11 is made of benzocyclobutene (BCB), or a cyclobutane derivative, and has a dielectric constant of about 2.7. Examples of other applicable cyclobutane derivatives include divinylsiloxane benzocyclobutane (DVS-BCB) and perfluorocyclobutane (PFCB) with a dielectric constant of about 2.3.

To deposit the organic polymer film 11 at an even lower temperature by a plasma CVD process, a plasma is preferably created from an inert gas such as Ar gas inside the deposition chamber with the film material (e.g., BCB) sprayed into the chamber. According to this technique, the energy of the resultant Ar plasma can be given to the particles of the sprayed material. Thus, even if the temperature of the substrate is as low as about 100° C., the organic polymer film 11 still can be deposited thereon. At that low temperature, the deposition process can be carried out while preventing the thermal deformation of the resist film 13 with much more certainty.

Preferred conditions for the plasma CVD process we carried out include a substrate temperature of 150° C. or less and an in-chamber total pressure between 0.1 Torr and 1 Torr (i.e., between about 13.3 Pa and about 133.3 Pa) during the deposition process. we laid down these conditions because of the following reasons. Firstly, when the in-chamber total pressure was more than 1 Torr, the organic polymer film 11 still could be deposited successfully, but was dissolved unintentionally in an organic solvent (e.g., ethyl alcohol) when the resist film 13 was lifted off. Secondly, where the in-chamber total pressure was less than 0.1 Torr, the organic polymer film 11 could not be deposited as intended. Thirdly, if the substrate temperature during the deposition process was higher than 150° C., then the resist film 13 cured and could not be lifted off.

Figure 2D:
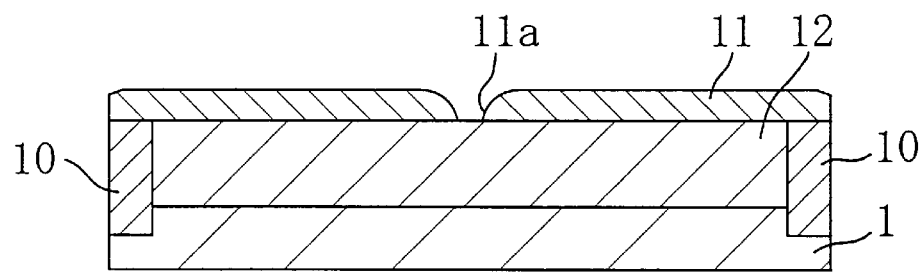

Thereafter, as shown in FIG. 2D, the resist film 13 is lifted off, thereby forming an opening 11a in the organic polymer film 11. That is to say, when the resist film 13 is removed, part of the organic polymer film 11, which has covered the side and upper surfaces of the resist film 13, is also peeled off along with the resist film 13. At the bottom of the opening 11a, the upper surface of the epitaxial layer 12 is exposed. The width of the opening 11a is almost equal to the width of the resist film 13, i.e., about 0.1 μm. It should be noted that the side faces of the opening 11a are tapered according to this embodiment. In this manner, by applying the lift-off technique to the organic polymer film 11 that has been formed by the plasma CVD process, the opening 11a can have a very small width.

A field effect transistor can be formed by performing known process steps after that. Specifically, a transistor can be formed in the following manner.

Figure 2E:
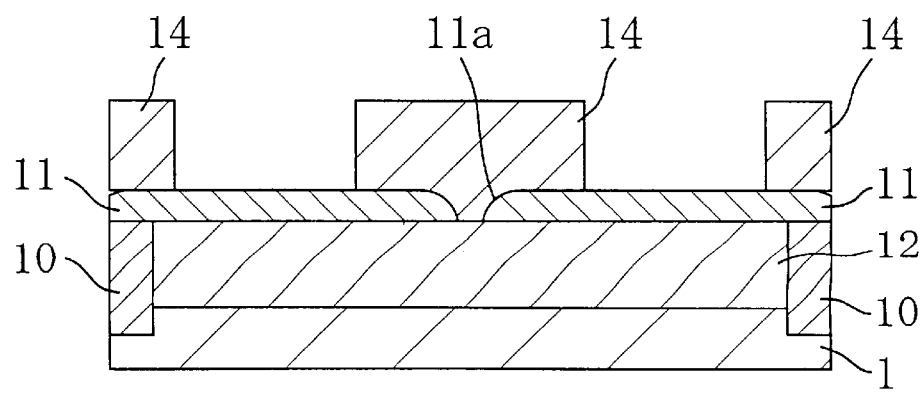
Figure 2F:
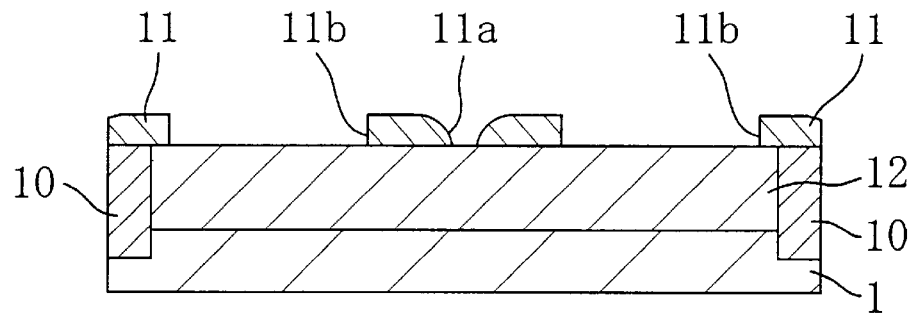

For example, a photoresist 14 with openings for forming ohmic electrodes 8 is defined on the organic polymer film 11 as shown in FIG. 2E. Next, as shown in FIG. 2F, the organic polymer film 11 is dry-etched with a mixture of $CF_4$ and $O_2$ gases while being masked by the photoresist 14. In this manner, openings 11b are formed.

Figure 2G:
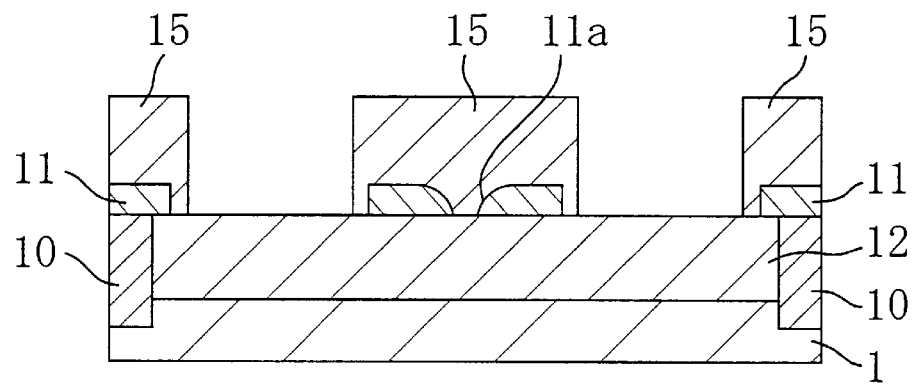
Figure 2H:
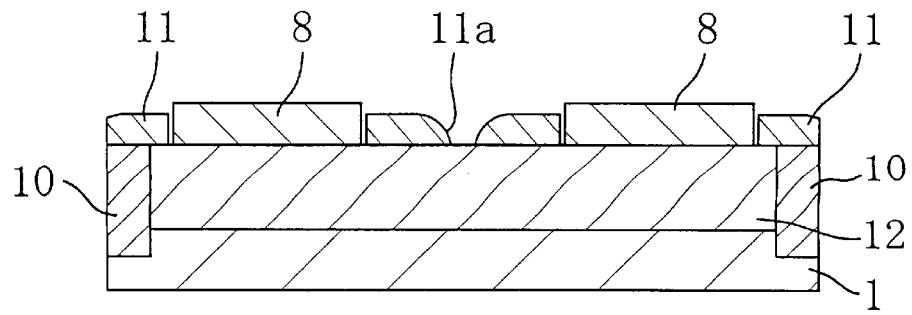

Subsequently, as shown in FIG. 2G, another photoresist 15, having openings that define the locations and shapes of the ohmic electrodes 8, is defined on the organic polymer film 11 and epitaxial layer 12. Then, an ohmic metal, e.g., an Ni/Au/Ge alloy, is deposited by an evaporation technique over the substrate and then the photoresist 15 with the excessive metal is lifted off, thereby forming ohmic electrodes 8 as shown in FIG. 2H.

Figure 2I:
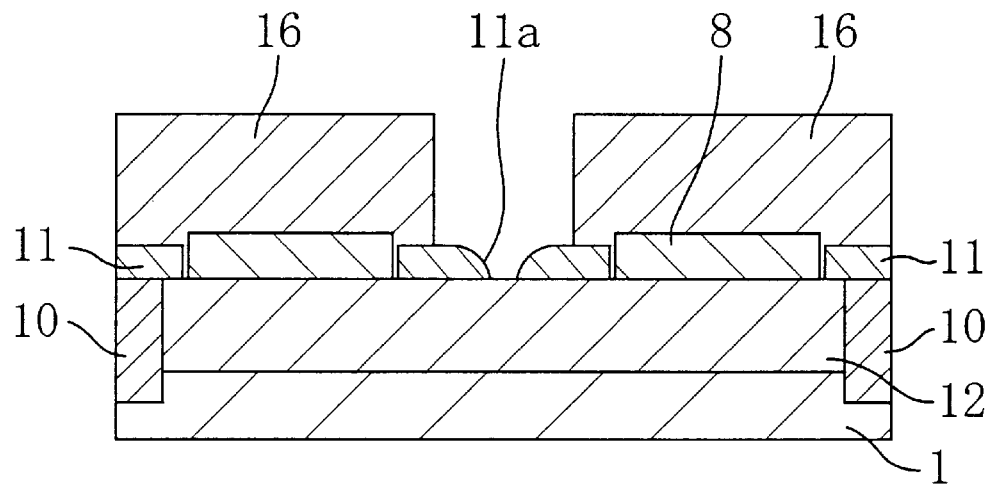
Figure 2J:
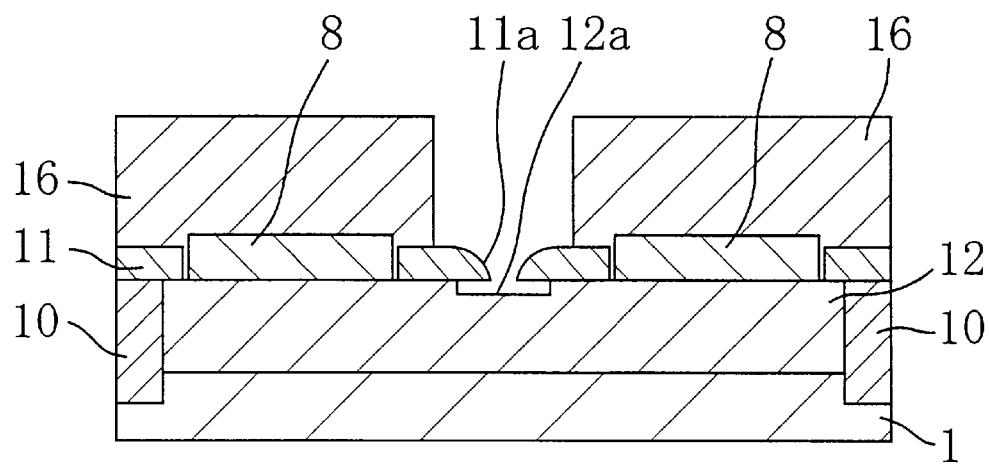

Thereafter, as shown in FIG. 2I, still another photoresist 16 is defined over the substrate to form a recess under the bottom of the opening 11a by partially etching the epitaxial layer 12 away (or the cap layer 7 more exactly). Then, using the photoresist 16 as a mask, that part of the cap layer 7 is removed to form an opening 12a as shown in FIG. 2J. As a result of this recess etching process, that part of the cap layer 7 no longer exists and the Schottky layer 6 is exposed at the bottom of the opening 12a. It should be noted that the threshold voltage of the resultant field effect transistor is controllable by the size of that particular part of the cap layer 7. For that reason, the conditions of the recess etching process may be determined appropriately according to the threshold voltage of the semiconductor device (or field effect transistor) to be fabricated.

Figure 2K:
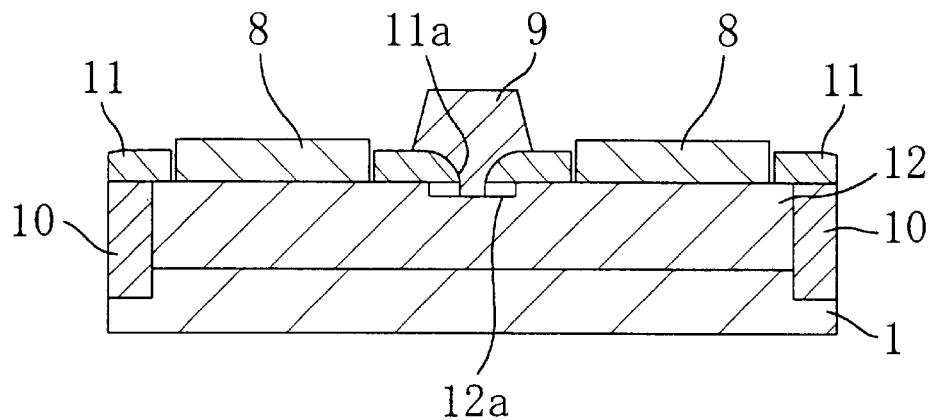
Figure 3:
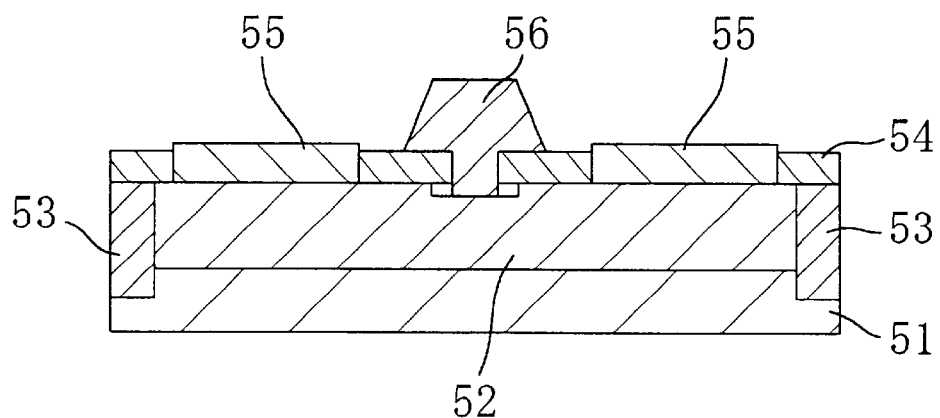
FIG. 3 is a cross-sectional view illustrating a semiconductor device formed by a known fabrication process.
Figure 4A:
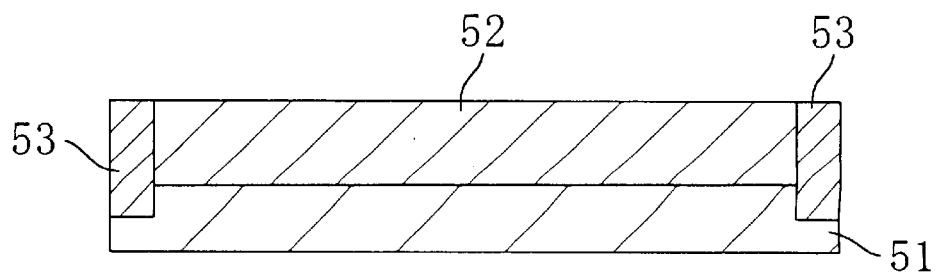
FIGS. 4A through 4G are cross-sectional views illustrating respective process steps for fabricating the device shown in FIG. 3.
Figure 4B:
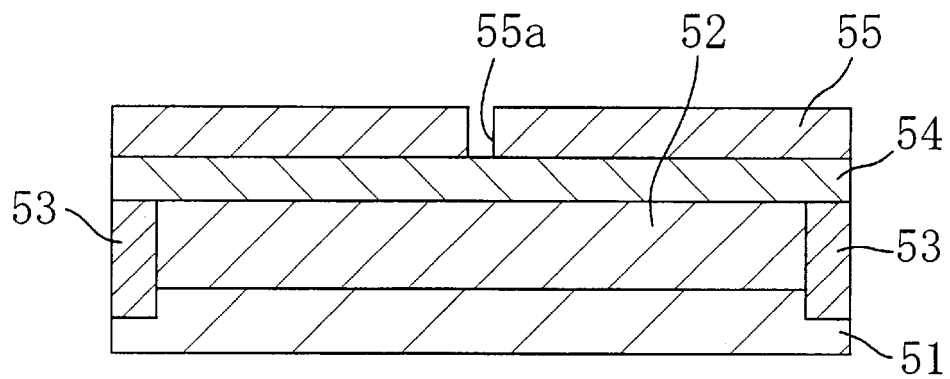
Figure 4C:
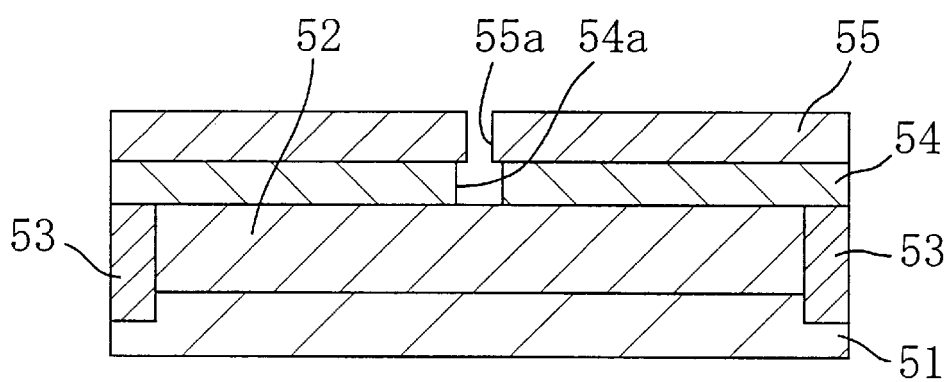
Figure 4D:
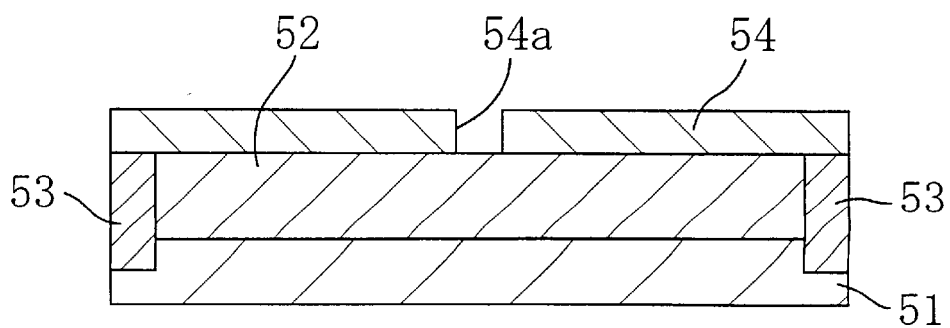
Figure 4E:
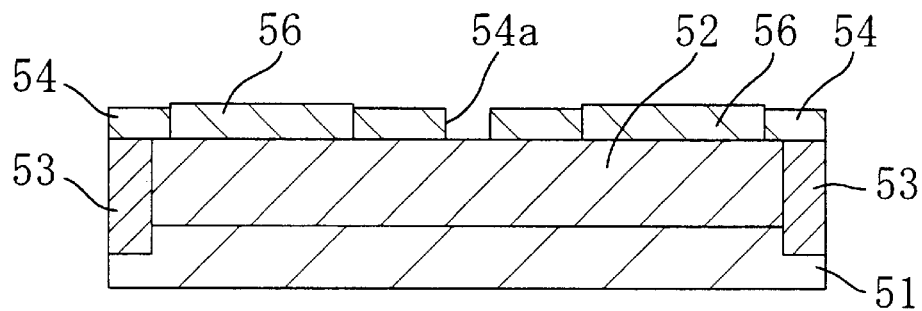
Figure 4F:
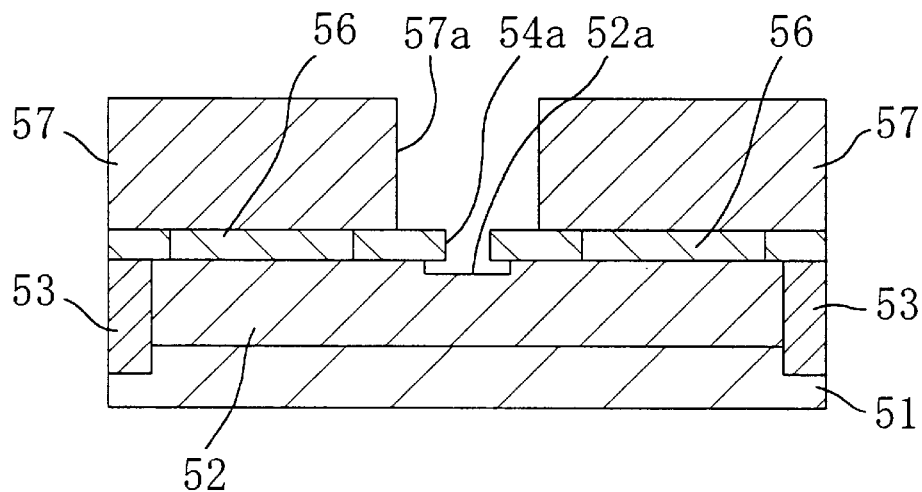
Figure 4G:
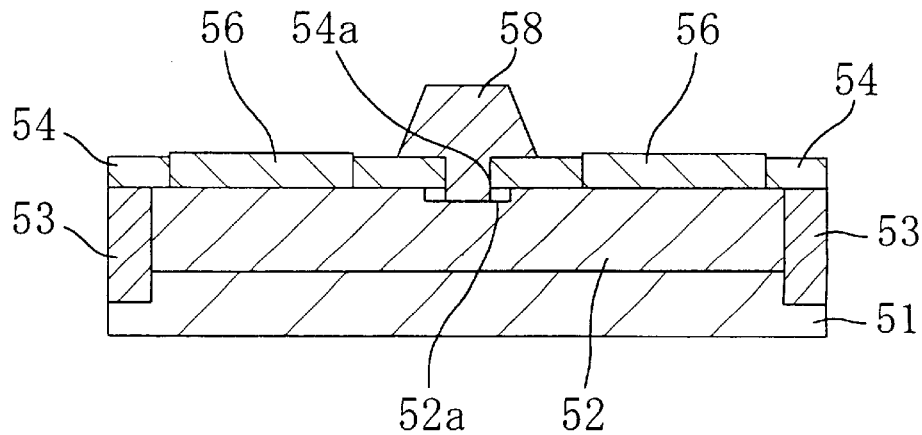
Figure 5A:
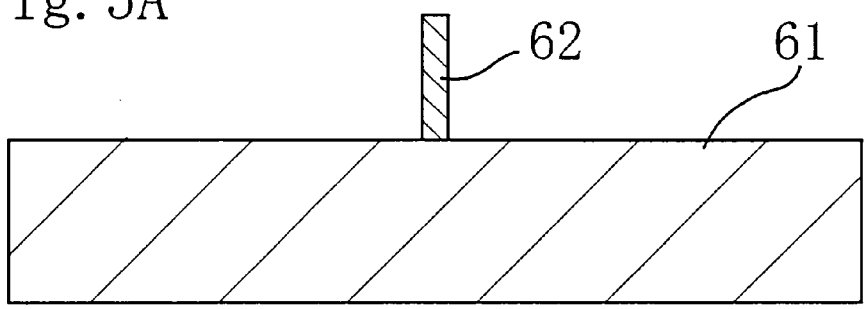
FIGS. 5A and 5B are cross-sectional views illustrating the process steps of forming an opening by a lift-off technique.
Figure 5B:
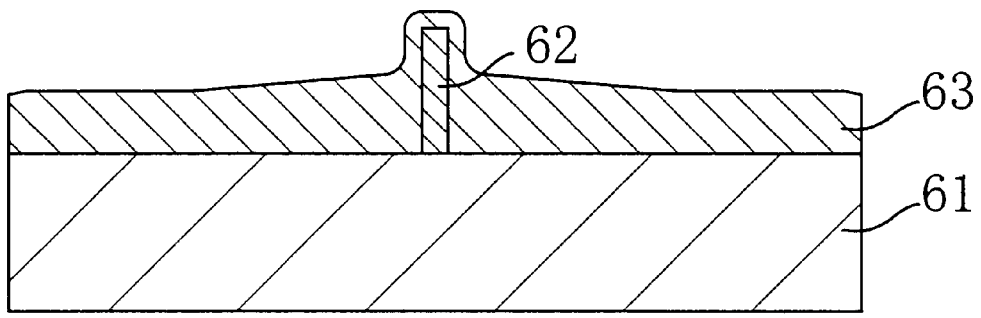

Finally, a metal film is deposited over the substrate by an evaporation technique, and then the photoresist 16 is lifted off along with the excessive metal. As a result, a field effect transistor, including a T-gate electrode 9, is formed as shown in FIG. 2K. The width of the gate electrode 9 at the bottom is defined by the width of the opening 11a, and is also about 0.1 μm.

According to this embodiment, even though the insulating film 11 near the gate electrode 9 is made of an organic polymer, the gate length can be shortened to 0.3 μm or less (e.g., about 0.1 μm). Thus, the radio frequency characteristics (including $f_T$, fmax and noise characteristic) of the transistor greatly improve. In addition, according to this embodiment, the gate electrode 9 can be formed by a lift-off technique. That is to say, the organic polymer film 11 can be patterned easily just by inverting the pattern for the resist film 13. In this manner, the width of the resist film 13 can be reflected on the resultant gate length very accurately. Stated otherwise, variation in gate length can be minimized. In contrast, if the gate electrode is formed by dry etching as in a known process, then the feature size of the resultant pattern is subject to change because some variation is normally inevitable for a dry etching process. As a result, the gate length also varies unintentionally.

Also, the organic polymer film 11, surrounding the gate electrode 9, is a low-κ film with a dielectric constant of about 2.7, which is much lower than that of $SiO_2$. Thus, according to this embodiment, a field effect transistor with a very small fringe capacitance (i.e., a parasitic capacitance associated with the gate electrode 9) can be formed. A field effect transistor with that small fringe capacitance can operate at a much higher speed. Accordingly, an ultrahigh frequency field effect transistor, which is effectively applicable to cultivating the millimeter wave bands, is realized. Specifically, where the organic polymer film 11 was made of BCB, the fmax value, a typical index representing the radio frequency characteristics of a device, could be as high as 170GHz, which is much higher than 140 GHz obtained by a device with the known insulating film of $SiO_2$. That is to say, the reduction in gate capacitance improves the radio frequency characteristics, or increases the gain.

In the foregoing embodiment, the organic polymer film 11 is made of BCB. Alternatively, to further reduce the fringe capacitance, the organic polymer film 11 may also be made of a fluoropolymer with a dielectric constant of 2.1. We confirmed that the organic polymer film 11 of a fluoropolymer can be deposited at a substrate temperature of 100° C. or less and at an in-chamber total pressure of 0.5 Torr or 260 Torr during the deposition process.

In the foregoing illustrative embodiment, the present invention has been described as being applied to a field effect transistor including a T-gate electrode. However, the present invention is not limited to any particular method of forming such a semiconductor device, but is broadly applicable to any semiconductor device fabrication process that needs forming a fine-line opening in an organic polymer film. Furthermore, the present invention does not have to be implemented as a method for fabricating a semiconductor device, but may be realized as a method of patterning an organic polymer film by forming a very small opening in it. A supporting or underlying substrate for the organic polymer film to be patterned does not have to be the GaAs substrate used for the foregoing embodiment, but may be any other semiconductor substrate of GaN, SiC or Si, an insulating substrate made of glass, for example, or an SOI substrate.

According to the present invention, an organic polymer film is deposited by a plasma CVD process, and can be patterned into any desired shape by forming a very small opening in it. In addition, now that it is possible to form an opening of such a small size in an organic polymer film, the fringe capacitance of the resultant gate electrode can be reduced considerably. Thus, the present invention realizes a field effect transistor operating in millimeter wave bands.

What is claimed is:

1. A method of patterning a film of an organic polymer, comprising the steps of:

defining a resist film on a selected area of a substrate;

depositing an organic polymer film over the substrate by a plasma CVD process so that the resist film is covered with part of the organic polymer film; and removing the resist film along with the part of the organic polymer film that has covered the resist film.

2. The method of claim 1, wherein the organic polymer film is a low-κ film with a dielectric constant lower than that of $SiO_2$.

3. The method of claim 2, wherein the low-κ film is made of a cyclobutane derivative.

4. The method of claim 3, wherein the cyclobutane derivative is benzocyclobutene (BCB).

5. The method of claim 2, wherein the low-κ film is made of a fluoropolymer.

6. The method of claim 1, wherein the organic polymer film is deposited within an inert gas ambient.

7. The method of claim 1, wherein a deposition temperature of the organic polymer film is lower than a temperature at which the resist film starts to degrade.

8. A method for fabricating a semiconductor device, comprising the steps of:

defining a resist film on a selected area of a substrate;

depositing an organic polymer film over the substrate by a plasma CVD process so that the resist film is covered with part of the organic polymer film;

removing the resist film along with the part of the organic polymer film that has covered the resist film, thereby forming an opening in the organic polymer film; and forming a gate electrode on the selected area of the substrate that is exposed inside the opening of the organic polymer film.

9. The method of claim 8, wherein the organic polymer film is a low-κ film with a dielectric constant lower than that of $SiO_2$.

10. The method of claim 9, wherein the low-κ film is made of a cyclobutane derivative.

11. The method of claim 10, wherein the cyclobutane derivative is benzocyclobutene (BCB).

12. The method of claim 9, wherein the low-κ film is made of a fluoropolymer.

13. The method of claim 8, wherein the organic polymer film is deposited within an inert gas ambient.

14. The method of claim 8, wherein a deposition temperature of the organic polymer film is lower than a temperature at which the resist film starts to degrade.

15. The method of claim 8, wherein the opening has a width of 0.3 μm or less and the gate electrode is a T-gate electrode.

* * * * *